(12) United States Patent
Lin et al.

(10) Patent No.: US 11,398,545 B2
(45) Date of Patent: Jul. 26, 2022

(54) SINGLE-MASK, HIGH-Q PERFORMANCE METAL-INSULATOR-METAL CAPACITOR (MIMCAP)

(71) Applicant: Intel Corporation, Santa Clara, CA (US)

(72) Inventors: Kevin Lin, Beaverton, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 884 days.

(21) Appl. No.: 16/017,964

(22) Filed: Jun. 25, 2018

(65) Prior Publication Data

US 2019/0393298 A1 Dec. 26, 2019

(51) Int. Cl.
*H01L 21/20* (2006.01)
*H01L 31/00* (2006.01)
*H01L 49/02* (2006.01)
*H01L 23/66* (2006.01)
*H01L 27/07* (2006.01)
*H01L 23/522* (2006.01)

(52) U.S. Cl.
CPC .......... *H01L 28/75* (2013.01); *H01L 23/5223* (2013.01); *H01L 23/66* (2013.01); *H01L 27/0733* (2013.01); *H01L 28/91* (2013.01); *H01L 28/92* (2013.01); *H01L 2223/6672* (2013.01); *H01L 2223/6677* (2013.01)

(58) Field of Classification Search
CPC . H01L 23/5223; H01L 27/0733; H01L 28/75; H01L 28/92
USPC ............................................ 438/381; 257/59
See application file for complete search history.

(56) References Cited

U.S. PATENT DOCUMENTS

| 7,238,584 | B2 * | 7/2007 | Chun | ...................... | H01L 28/20 438/381 |
|---|---|---|---|---|---|
| 7,838,882 | B2 * | 11/2010 | Fujikawa | ................ | H01L 27/12 257/59 |
| 8,790,975 | B2 * | 7/2014 | Baars | ...................... | H01L 21/28 438/243 |
| 8,993,404 | B2 | 3/2015 | Kobrinsky et al. | | |

(Continued)

FOREIGN PATENT DOCUMENTS

| WO | WO-20160209246 | 12/2016 |
|---|---|---|
| WO | WO-2017111803 | 6/2017 |
| WO | WO-2018004651 | 1/2018 |

*Primary Examiner* — Calvin Lee
(74) *Attorney, Agent, or Firm* — Schwabe, Williamson & Wyatt, P.C.

(57) ABSTRACT

An integrated circuit structure comprises a first dielectric layer disposed above a substrate. The integrated circuit structure comprises an interconnect structure comprising a first interconnect on a first metal layer, a second interconnect on a second metal layer, and a via connecting the first interconnect and the second interconnect, the first interconnect being on or within the first dielectric layer. A metal-insulator-metal (MIM) capacitor is formed in or on the first dielectric layer in the first metal layer adjacent to the interconnect structure. The MIM capacitor comprises a bottom electrode plate comprising a first low resistivity material, an insulator stack on the bottom electrode plate, the insulator stack comprising at least one of an etch stop layer and a high-K dielectric layer; and a top electrode plate on the insulator stack, the top electrode plate comprising a second low resistivity material.

23 Claims, 10 Drawing Sheets

(56) References Cited

U.S. PATENT DOCUMENTS 9,691,839 B2 6/2017 Lindert et al.
10,050,143 B2 * 8/2018 Ando ................ H01L 27/11507
438/243
10,141,394 B2 * 11/2018 Detalle ............. H01L 21/76898

* cited by examiner

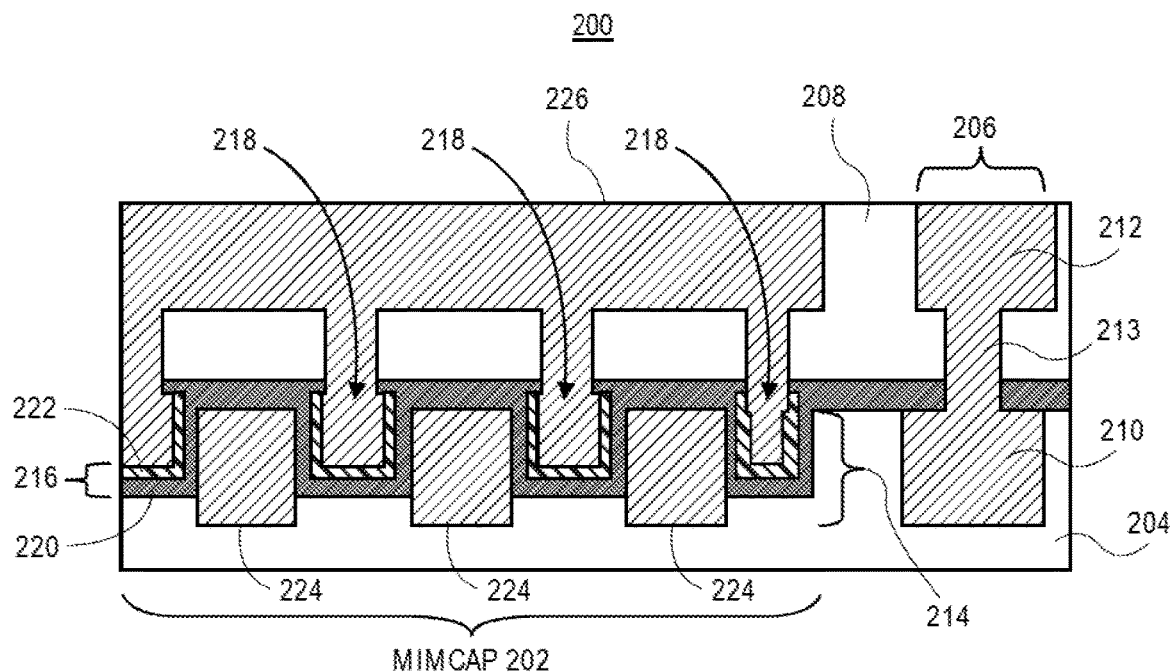
FIG. 2A
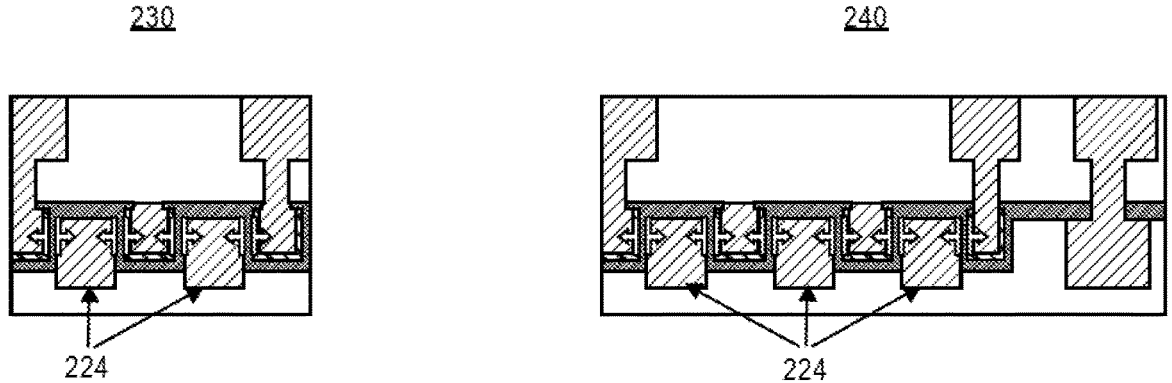
FIG. 2B  FIG. 2C

```
┌─────────────────────────────────────────────────────────────┐
│ FORM A FIRST ELECTRODE PLATE COMPRISING A FIRST LOW         │
│ RESISTIVITY MATERIAL IN OR ON A FIRST DIELECTRIC LAYER      │
│ ADJACENT TO AN INTERCONNECT STRUCTURE SPANNING FIRST        │
│ AND SECOND METAL LEVELS                                     │
│ 400                                                         │
└─────────────────────────────────────────────────────────────┘
                              ↓
┌─────────────────────────────────────────────────────────────┐
│ FORM AN INSULATOR STACK IN ELECTRICAL CONTACT WITH THE      │
│ FIRST ELECTRODE PLATE, THE INSULATOR STACK COMPRISING AT    │
│ LEAST ONE OF AN ETCH STOP LAYER AND A HIGH-K DIELECTRIC     │
│ LAYER                                                       │
│ 402                                                         │
└─────────────────────────────────────────────────────────────┘
                              ↓
┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐
│ (OPTIONALLY) CLAD THE FIRST ELECTRODE WITH A BARRIER LAYER  │
│ 404                                                         │
└ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
                              ↓
┌─────────────────────────────────────────────────────────────┐
│ FORM A SECOND ELECTRODE PLATE COMPRISING A SECOND LOW       │
│ RESISTIVITY MATERIAL ON AND IN ELECTRICAL CONTACT WITH THE  │
│ INSULATOR STACK                                             │
│ 406                                                         │
└─────────────────────────────────────────────────────────────┘
                              ↓
┌─────────────────────────────────────────────────────────────┐
│ COMPLETE FORMATION OF CAPACITOR (E.G., MIMCAP)              │
│ 408                                                         │
└─────────────────────────────────────────────────────────────┘
```

FIG. 4

SINGLE-MASK, HIGH-Q PERFORMANCE METAL-INSULATOR-METAL CAPACITOR (MIMCAP)

TECHNICAL FIELD

Embodiments of the disclosure are in the field of integrated circuit structures and, in particular, single-mask, high-Q (quality factor) performance metal-insulator-metal capacitor (MIMCap).

BACKGROUND

In the fields of wireless communication and power management, various components can be implemented using solid-state devices, including transistors and capacitors, for example. For instance, such solid-state devices can be formed on an integrated circuit and be used for radio frequency (RF) communication applications, such as for RF front end applications. The RF front end is a generic term for the circuitry between an antenna and a digital baseband system. For RF applications, metal-insulator-metal capacitors (MIMCaps) are used for passive components. For instance, MIMCaps can be used for impedance matching and impedance tuning, to name a few example applications. Generally, capacitors include two electrically conductive layers, referred to as electrodes, separated by an insulator or dielectric material. The insulator or dielectric portion of the capacitor can act to increase the capacitor's charge capacity, such as by storing energy by becoming polarized, for example. In the field of MIMCaps and capacitors in general, two metrics are important: capacitance density and breakdown voltage. Capacitance density is defined as the ratio of electric charge on each conductor that can be achieved to the potential difference between them, for a given area, where higher capacitance densities are generally desired. Breakdown voltage is the minimum voltage that causes a portion of the insulator or dielectric within the MIMCap structure to become electrically conductive, which limits the maximum energy that can be effectively stored in the capacitor.

What is needed is a low parasitic resistance MIMCap for high-Q operations at high frequency. It is also desirable that the MIMCap minimize cost of by minimizing the number of mask required during fabrication.

BRIEF DESCRIPTION OF THE DRAWINGS

FIGS. 2A-2C are cross-section diagrams of an example integrated circuit (IC) structure including a nonplanar MIMCap having a generally corrugated profile in accordance with a first embodiment.

FIG. 4 is a flow diagram illustrating a process for fabricating an IC structure including a low parasitic resistance MIMCap for high-Q operations at high frequency, in accordance with some embodiments of the present disclosure.

DESCRIPTION OF THE EMBODIMENTS

Figure 1A:
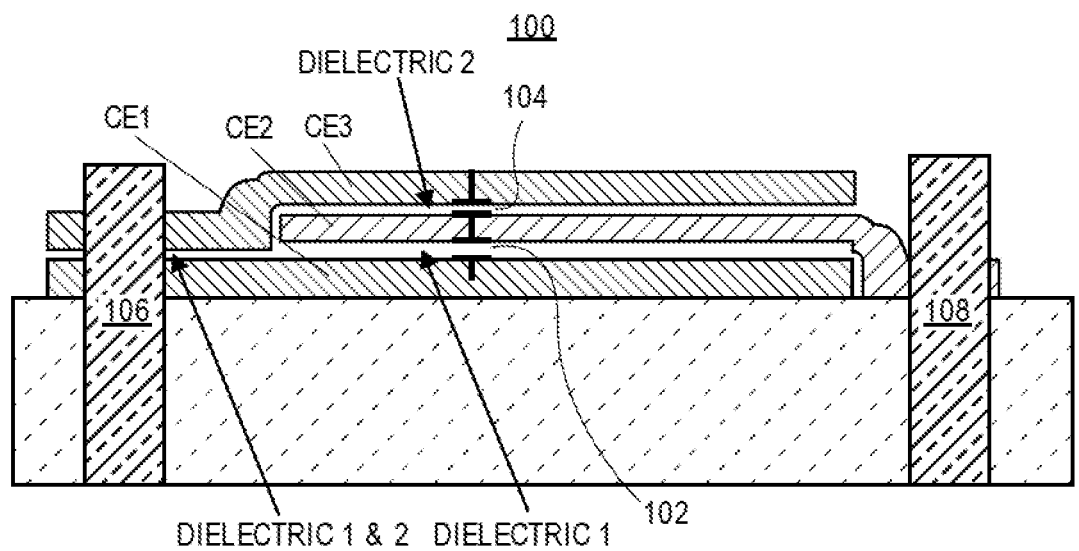
FIG. 1A shows an embodiment of a MIMCap stack having a parallel plate typography.

A single-mask, high-Q (quality factor) performance metal-insulator-metal capacitor (MIMCap) is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures, where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures, where the individual devices (e.g., transistors, capacitors, resistors, etc.) are interconnected with wiring on the wafer, e.g., the metallization layer or layers. BEOL includes contacts, insulating layers (dielectrics), metal layers, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating a single-mask, high-Q performance metal-insulator-metal capacitor (MIMCap). In accordance with one or more embodiments described herein, the MIMCap comprises a bottom electrode plate comprising a low resistivity material and a top electrode plate also comprising a low resistivity material, such as copper. An insulator stack comprising at least one of an etch stop layer and a high-K dielectric layer is located between the bottom electrode plate and the top electrode plate. Applications of such systems may include, but are not limited to back end (BEOL) logic, high-Q RF and analog solutions, mask fabrication, increased capacitor density, and fabrication cost reductions due to the use of a single mask.

Embodiments described herein may include non-planar and planar MIMCap structures that effectively lower top and bottom resistance, while increasing capacitor density. One or more embodiments of a MIMCap may be implemented with a corrugated profile to provide higher capacitor density. One or more other embodiments of a MIMCap may implemented with a planar structure comprising an etched "tub" lined with a high-K dielectric (higher capacitance density) and filled with a highly conductive material to form the top electrode plate.

Figure 1B:
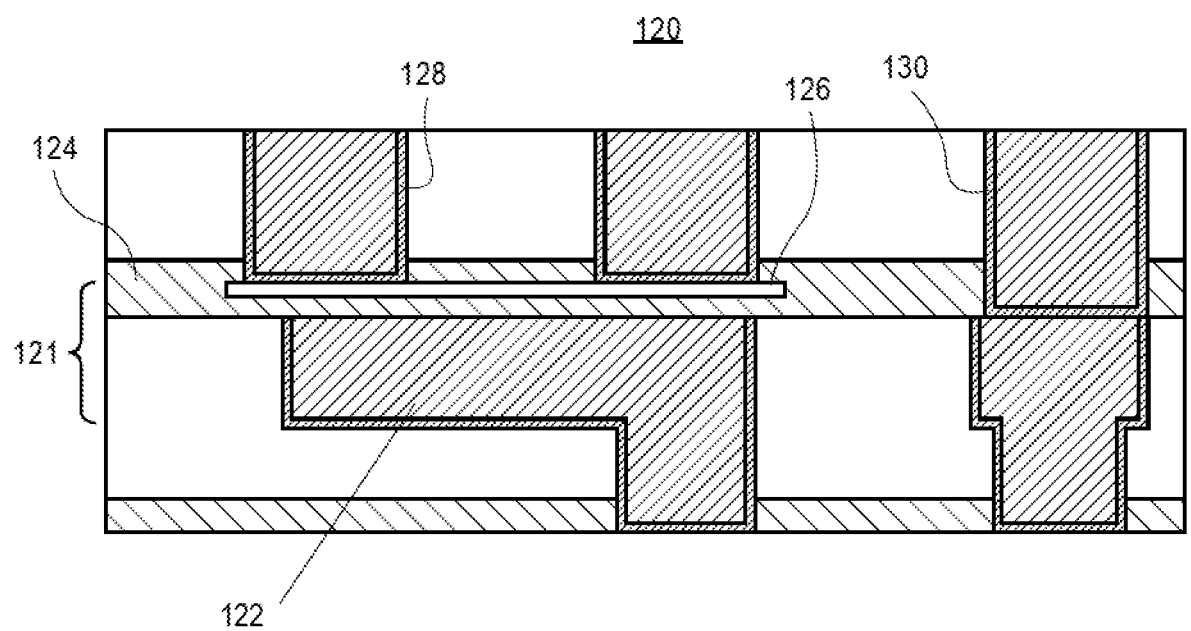
FIG. 1B shows a topology of a RF MIMCap that integrates existing metal interconnect as a bottom electrode plate.

To provide context, FIGS. 1A and 1B are cross-section diagrams of state-of-the-art metal-insulator-metal capacitors topographies. FIG. 1A shows an embodiment of a MIMCap stack 100 having a parallel plate typography. The MIMCap stack 100 comprises a lower capacitor 102 and an upper capacitor 104 formed from three parallel capacitor electrode plates labeled CE1, CE2 and CE3. The lower capacitor 102 comprises capacitor electrodes CE1 and CE2 with dielectric layer 1 in-between. The upper capacitor 104 comprises capacitor electrodes CE2 and CE3 with dielectric layer 2 in-between. Capacitor electrodes CE1 and CE3 (with a combination of dielectric layers 1 & 2 in-between) are electrically connected to via 106, while capacitor electrode CE2 is electrically connected to via 108. In this embodiment, the capacitor electrode plates CE1, CE2 and CE3 comprise a thin-film titanium nitride (TiN) and the dielectric layers 1 and 2 may comprise a high-K material.

The capacitance C for a capacitor is given by the expression C=eA/d where e is a dielectric constant, A is the area of the capacitor electrodes, and d is the thickness of the capacitor dielectric layer between the two capacitor electrodes (i.e., the distance between the capacitor electrodes). The Q factor of a capacitor, also known as the quality factor, or simply Q, represents the efficiency of a given capacitor in terms of energy losses. The Q factor for a capacitor is defined as $X_c/R$, where $X_c$ is the capacitor reactance expressed in ohms, and R is the equivalent series resistance (ESR) of the capacitor. To improve Q, it is desirable to maximize $X_c$ while minimizing the R.

Most applications do not need to take the Q factor into consideration, and standard capacitors may be used in those applications. However, the Q factor is an important capacitor characteristics in the design of RF circuits because at RF frequencies, the ESR increases with frequency and dissipative losses increase as well. Thus, high-Q capacitors are typically used in RF circuits to reduce high-frequency losses. Although the use of a high-K material is an improvement over dielectrics such as silicon dioxide, the MIMCap stack 100 and similar technologies do not support high-Q RF applications due to the long-distance required for electrons to conduct through the highly resistive thin-film TiN electrodes to reach the vias 106 and 108

FIG. 1B shows a topology 120 of a RF MIMCap 121 that integrates existing metal interconnect (e.g., copper) as a bottom electrode plate 122. An etch stop layer 124 over the bottom electrode plate 122 acts as an insulator, and a thin-film titanium nitride (TiN) material within the etch stop layer 124 comprises the top electrode plate 126. Vias 128 are shown connecting to the top electrode plate 126 from upper metal layers. Another via 130 adjacent to the RF MIMCap 121 is shown spanning two metal layers. The topology 120 is an improvement over the MIMCap stack 100 of FIG. 1A because the vias 128, 130 can be located closer to the TiN top electrode plate 126 and because the bottom electrode plate 122 comprises copper, which has a higher conductivity than TiN.

However, one drawback to the RF MIMCap 121 is that such a typography has a negative impact on capacitance density. In addition, an RF MIMCap 121 solution needs the insulator material to function as both the etch stop film/hermetic seal for copper as well as the dielectric for the MIMCap. This reduces the flexibility of the insulator material. Furthermore, only the bottom plate is highly conductive, as there are still losses through the top electrode plate 126.

Accordingly, one or more embodiments described herein are directed to an improved high-Q performance, low-parasitic-resistance MIMCap that can be fabricated using a single mask. The MIMCap of the present embodiments comprises bottom and top electrode plates both made of a low resistivity material, and an insulator stack comprising at least one of an etch stop layer and a high-K dielectric layer on the bottom electrode plate, and the top electrode plate on the insulator stack.

More particularly, an IC structure may comprise a MIMCap formed in or on a first dielectric layer in a first metal layer adjacent to an interconnect structure. The first dielectric layer is formed above a substrate and a second dielectric layer is formed over the first dielectric layer. The interconnect structure comprises a first interconnect within the first dielectric layer in the first metal layer, a second interconnect within the second dielectric layer in the second metal layer, and a via connecting the first interconnect and the second interconnect. In accordance with the present embodiments, the MIMCap comprises a bottom electrode plate comprising a first low resistivity material. An insulator stack comprising at least one of an etch stop layer and a high-K dielectric layer is on the bottom electrode plate. A top electrode plate comprising a second low resistivity metal is on the insulator stack. In one embodiment, the first metal layer comprises M1 and the second level comprises M2, although in other embodiments, the MIMCap and the interconnect structure may be formed on any metal layers.

Two embodiments are disclosed for a high-Q performance MIMCap. In a first embodiment, the MIMCap comprises a plurality of floating conductive lines as the bottom electrode plate that gives the MIMCap a generally corrugated profile to provide a higher capacitor density, as described with respect to FIGS. 2A-2C. In a second embodiment, the MIMCap comprises a planar structure having a conductive line as the bottom electrode plate, and the insulator stack and the top electrode implemented within a cavity formed in a dielectric layer over the conductive line. The top and bottom electrodes comprise a low resistivity, highly conductive material, as described with respect to FIGS. 3A-3B.

In both the first and second embodiments, the first low resistivity material of the bottom electrode plate and the second low resistivity material of the top electrode plate comprise copper. In other embodiments, the bottom and top electrodes may comprise any high conductivity metal such as tantalum. In one embodiment, the first low resistivity material of the bottom electrode plate is the same as the second low resistivity material of the top electrode plate. In another embodiment, the first low resistivity material of the bottom electrode plate may be different than the second low resistivity material of the top electrode plate.

Although in the first and second embodiments, the low resistivity material may comprise copper or tantalum, the phrase "low resistivity material" may refer to any material having a resistivity higher than $2 \times 10^8$ Ωm and a conductivity greater than $0.1 \times 10^7$ Ωm. In one embodiment, the high-Q MIM capacitors are described below having a Q factor approximately of over 10,000 at 1 MHz and approximately 1,000 at 100 MHz. In another embodiment, the high-Q MIM capacitors are described below may have a Q factor value of approximately 250 at 5 GHz, and approximately 50 at 30 GHz. In contrast, standard capacitors can have a Q factor as low as 50 at 1 kHz.

In both the first and second embodiments, the high-K dielectric may comprise binary and ternary metal oxide insulators with a relative dielectric constant greater than about 9 and comprising transition metals from groups 3-5, lanthanides and Al. Representative examples of suitable high-K dielectrics may include a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof.

FIGS. 2A-2C are cross-section diagrams of an example integrated circuit (IC) structure 200 including a nonplanar MIMCap having a generally corrugated profile in accordance with a first embodiment. In the first embodiment, the IC structure 200 comprises a MIMCap 202 formed in or on a first dielectric layer 204 in a first metal layer (e.g., Mn) adjacent to an interconnect structure 206. The first dielectric layer 204 is formed above a substrate (not shown) and a second dielectric layer 208 is formed over the first dielectric layer 204 in a second metal layer (e.g., Mn+1). The interconnect structure 206 comprises a first interconnect 210 within the first dielectric layer 204 in the first metal layer, a second interconnect 212 within the second dielectric layer 208 in the second metal layer, and a via 213 connecting the first interconnect 210 and the second interconnect 212.

In the first embodiment, the MIMCap 202 having a corrugated profile comprises a bottom electrode plate 214 comprising a first low resistivity material and top electrode plate 218 comprising a second low resistivity metal. An insulator stack 216 comprising at least one of an etch stop layer 220 and a high-K dielectric layer 222 is between the bottom electrode plate 214 and the top electrode plate 218.

According to the first embodiment, the corrugated profile of the MIMCap 202 is provided by the layout of the bottom electrode plate 214 relative to a top electrode plate 218. The bottom electrode plate 214 comprises a plurality of two or more floating conductive lines 224 that have portions protruding from a surface of the first dielectric layer 204 and are laterally spaced apart by air gaps that form recesses therebetween. The conductive lines 224 are referred to as floating because they are unsupported by any other metal and not electrically grounded, thus appearing to float in the first dielectric layer 204. The insulator stack 216 is conformally disposed on sides and tops of the floating conductive lines 224 protruding from the first dielectric layer 204 and on the surface of the first dielectric layer 204 between the floating conductive lines 224. The top electrode plate 218 is formed on the insulator stack 216 on the sides and bottom of the recesses between the floating conductive lines 224 comprising the bottom electrode plate 214. In one embodiment, the second dielectric layer 208 is formed on the insulator stack on a top surface of the protruding portions of floating conductive lines 224. In one embodiment, the top electrode plate may be further connected to one or more metal interconnects 226 in the second metal layer (e.g., M2).

In one embodiment, the floating conductive lines 224 may be laterally spaced apart by the air gaps by a distance of approximately 80-160 nm. In one embodiment, the insulator stack 216 may have a thickness of approximately 50 nm to provide a high-K, low voltage etch stop, and a thickness of up to 200 nm for a high voltage etch stop.

The MIMCap 202 may be tuned to meet the requirements of a particular application by, for example, making the high-K layer optional or not connecting each of the bottom electrode plates 214. For instance, every second or every third ones of the capacitors comprising the MIMCap 202 may be connected to M2 to trade-off capacitance density with breakdown voltage and positive or negative bias uniformity, as shown in FIGS. 2B and 2C.

FIGS. 2B and 2C are diagrams illustrating alternative electrode plate connection options for the corrugated MIMCap structure. The embodiments shown implement a series connection for the electrode plates. FIG. 2B shows a series connection that provides a medium high voltage corrugated MIMCap structure. In this embodiment, every other conductive line 224 comprising the MIMCap 230 is connected to M2. This is accomplished by covering the top electrode plates 218 of the capacitors with dielectric layer 208. FIG. 2C shows a corrugated MIMCap structure having a series connection that provides a super high voltage corrugated MIMCap structure. In this embodiment, every fourth conductive line 224 comprising the MIMCap 240 is connected to M2. One advantage of these structures is that the MIMCap 230, 240 is symmetrical in that both leads are on M2.

Figure 3A:
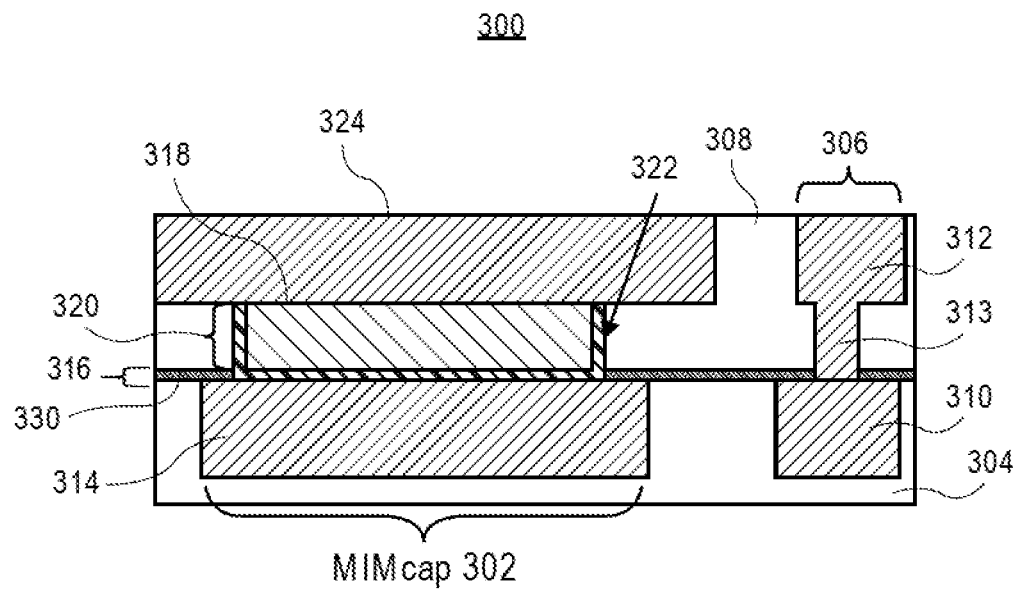
FIGS. 3A and 3B are cross-section diagrams of an example integrated circuit (IC) structure including a planar MIMCap having a capacitor cavity in accordance with a second embodiment.
Figure 3B:
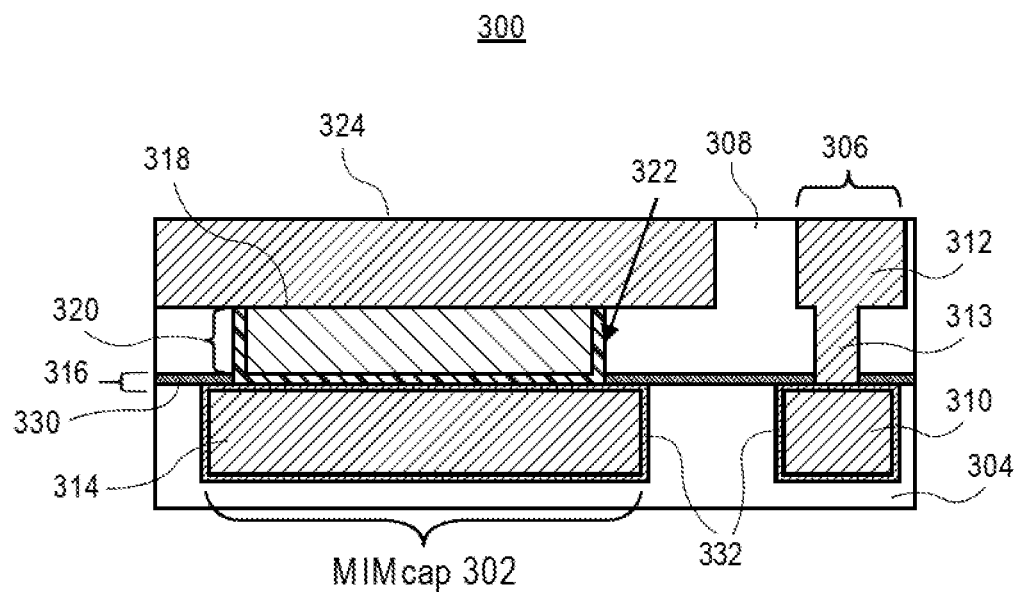

FIGS. 3A and 3B are cross-section diagrams of an example integrated circuit (IC) structure including a planar MIMCap having a capacitor cavity in accordance with a second embodiment. In the second embodiment, the IC structure 300 comprises a MIMCap 302 formed in or on a first dielectric layer 304 in a first metal layer (e.g., Mn) adjacent to an interconnect structure 306. The first dielectric layer 304 is formed above a substrate (not shown) and a second dielectric layer 308 is formed over the first dielectric layer 304 in a second metal layer (e.g., Mn+1). An etch stop layer 330 separates the two dielectric layers 304 and 308. The interconnect structure 306 comprises a first interconnect 310 within the first dielectric layer 304 in the first metal layer, a second interconnect 312 within the second dielectric layer 308 in the second metal layer, and a via 313 connecting the first interconnect 310 and the second interconnect 312.

Similar to the first embodiment, the MIMCap 302 comprises a bottom electrode plate 314 comprising a first low resistivity material and top electrode plate 318 comprising a second low resistivity metal. An insulator stack 316 comprising at least an etch stop layer 330 and a high-K dielectric layer 322 is between the bottom electrode plate 314 and the top electrode plate 318.

However, in contrast to the first embodiment, the MIMCap 302 of the second embodiment has a planar profile in which the bottom electrode plate 314 in the first metal layer (e.g., M1) is formed from a conductive line comprising the first low resistivity material. A capacitor cavity 320 is formed on the bottom electrode plate 314 in the second dielectric layer 308. The insulator stack 316 comprises at least one of etch stop layer 330 and high-K dielectric layer 322 formed on the bottom on the capacitor cavity 320. The top electrode plate 318 comprises the second low resistivity material filling a remainder of the capacitor cavity 320. In one embodiment, the insulator stack 316 comprises the etch stop layer 330, and the high-K dielectric layer 322, which is conformally disposed on the etch step layer 330 and on sidewalls of the capacitor cavity 320. In another embodiment, the capacitor cavity 320 is formed directly on the bottom electrode 314 and the high-K dielectric layer 322 is conformally disposed on both the bottom and sidewalls of the capacitor cavity 320. In a further embodiment, a second conductive line 324 may be formed on the top electrode plate 318 in the second metal layer (e.g., M2), as shown.

FIG. 3B is shows an embodiment where the interconnect lines on the first metal layer (e.g., M1), including the bottom electrode 314 are fully clad with a barrier layer 332, such as tantalum, to form a fully clad bottom electrode. Fully clad is understood as the barrier layer 332 fully surrounding all of the surfaces of the bottom electrode 314 and interconnect 310, including top and bottom surfaces and opposing side surfaces, including any surfaces that are not surrounded or bordered by the first dielectric layer 304 or etch stop layer 330 (i.e., the top surface). In the case where the bottom electrode comprises copper, the Ta barrier layer 332 decouples a need for a Cu diffusion barrier with the high-K. In this embodiment, the capacitor cavity 320 is formed on the fully clad bottom electrode 314 and the high-K dielectric layer 322 is conformally disposed on the barrier layer 332.

In the second embodiments shown in FIGS. 3A and 3B, the capacitor cavity 320 may be approximately 5-100 nanometers in thickness, and the size of the capacitor cavity 320 is greater than approximately 500×500 nanometers but less than 10×10 microns.

FIG. 4 is a flow diagram illustrating a process for fabricating an IC structure including a low parasitic resistance MIMCap for high-Q operations at high frequency, in accordance with some embodiments of the present disclosure. The process may begin by forming a first electrode plate comprising a first low resistivity material in or on a first dielectric layer adjacent to an interconnect structure spanning first and second metal layer (block 400). For instance, the first electrode plate may be bottom electrode plate 214 or 314, and the first dielectric layer may be first dielectric layer 204 or 304, as variously described herein. In some embodiments, the first dielectric layer may be formed prior to forming the first electrode plate.

An insulator stack is formed in electrical contact (e.g., in direct physical contact) with the first electrode plate, the insulator stack comprising at least one of an etch stop layer and a high-k dielectric layer (block 402). For example, the insulator stack may be insulator stack 216 or 316. In some embodiments, the insulator stack may be formed on and/or above the first electrode plate, as shown in FIGS. 2A-2C and 3A-3B, for example. The method continues with optionally cladding the first electrode plate with a barrier layer to form a fully clad first electrode plate (block 404). For instance, the first electrode plate is fully clad with a barrier layer according to the second embodiment where such a process is performed. However, in some embodiments, cladding of the first electrode plate need not be performed.

A second electrode plate comprising a second high resistivity material is formed on and in electrical contact with the insulator stack (block 406). For instance, the second electrode plate may be the top electrode plate 218 and 318 as variously described herein. In some embodiments, the second electrode plate may be formed at least one of on and above the insulator stack. The method continues with completing formation of a capacitor device, such as a MIMCap device (block 408), which can be performed using any suitable techniques and structures as can be understood based on this disclosure. Numerous variations and configurations will be apparent in light of this disclosure.

FIGS. 5A-5F illustrate an angled three-dimensional view showing the fabrication process for fabricating an IC structure including a low parasitic resistance MIMCap having a corrugated profile for high-Q operations according to the first embodiment of FIGS. 2A-2C.

Figure 5A:
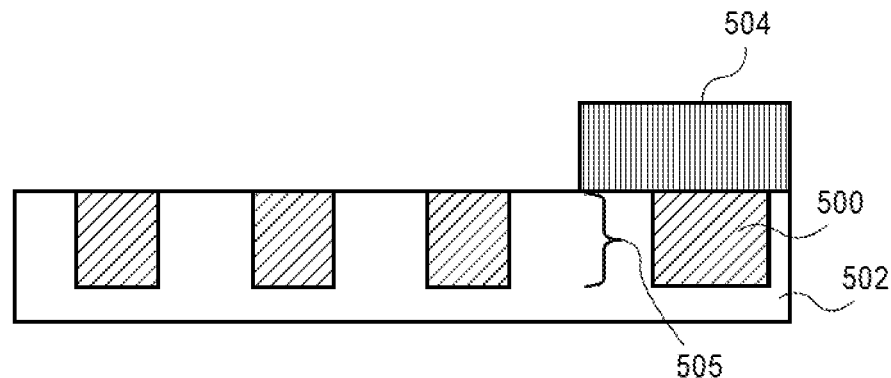
FIGS. 5A-5F illustrate an angled three-dimensional view showing the fabrication process for fabricating an IC structure including a low parasitic resistance MIMCap having a corrugated profile for high-Q operations according to the first embodiment of FIGS. 2A-2C.

FIG. 5A illustrates the fabrication process after floating conductive lines 500 comprising a low resistivity material are formed in a first dielectric layer 502 in a first metal layer (e.g., M1), and a mask 504 (hard mask or photoresist) is patterned with an opening over the conductive lines from which the MIMCap will be fabricated. As described above, the floating conductive lines 500 are unsupported and ungrounded in the first dielectric layer 502. In one embodiment, at least a portion of the floating conductive lines 500 in the first metal layer form the bottom electrode plate 505 of the MIMCap.

Figure 5B:
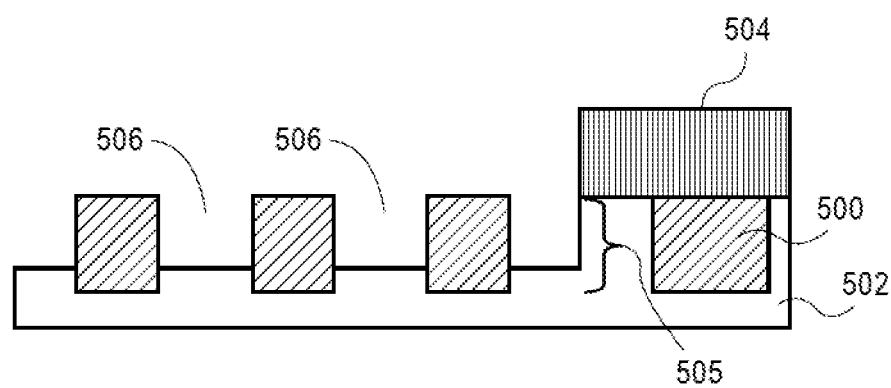

FIG. 5B illustrates the fabrication process after an air gap etch is performed on the first dielectric layer 502 to form recesses 506 therein adjacent to the bottom electrode plate 505 that exposes upper portions of bottom electrode plate 505 from the etched first dielectric layer 502. The first dielectric layer 502 may be recessed via any suitable standard, custom, or proprietary technique(s), as will be apparent in light of this disclosure. In some cases, recessing of dielectric layer 502 may be performed via any one, or combination, of an isotropic etch process and an anisotropic etch process. A given etch process may involve a wet etch or a dry etch (or both), and the particular etch chemistry employed by a given applied etch process may be customized, as desired for a given target application or end-use. In the current embodiment, an air gap etch process is utilized in recessing dielectric layer 502. The depth and degree of recessing of dielectric layer 502 can be controlled to provide a given amount of symmetry/asymmetry and isotropy/anisotropy desired.

Figure 5C:
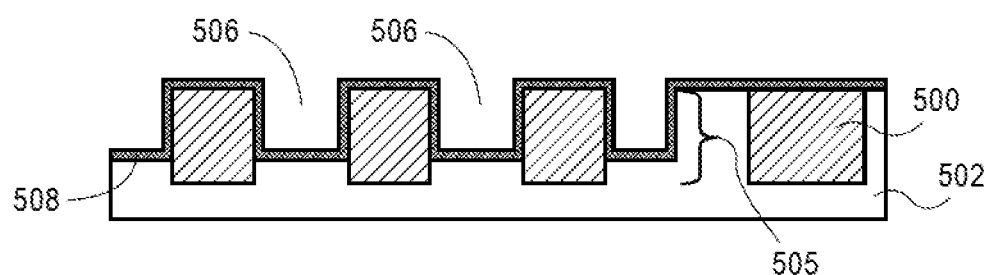

FIG. 5C illustrates the fabrication process after removal of the hard mask 504 and formation of an etch stop layer 508 over the first dielectric layer 502 and exposed upper portions of the bottom electrode plates 505, including surfaces uncovered by removal of the hard mask 504. In one embodiment, the etch stop layer 508 is conformally deposited over the bottom electrode plates 505 and the first dielectric layer 502.

Figure 5D:
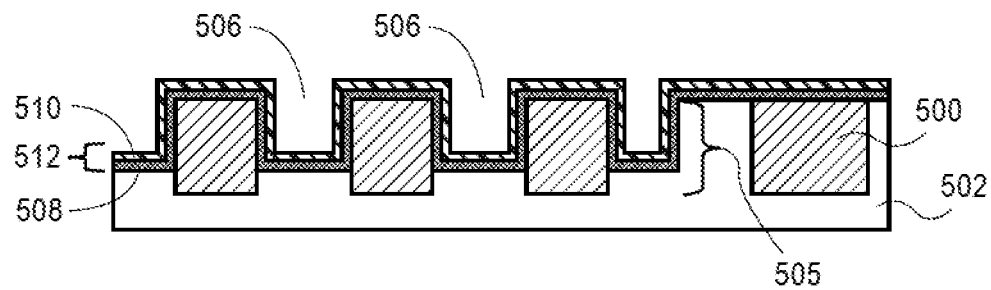

FIG. 5D illustrates the fabrication process after a high-K material 510 is conformally formed over the etch stop layer 508. The etch stop layer 508 and the high-K layer 510 form an insulator stack 512 for the MIMCap.

Figure 5E:
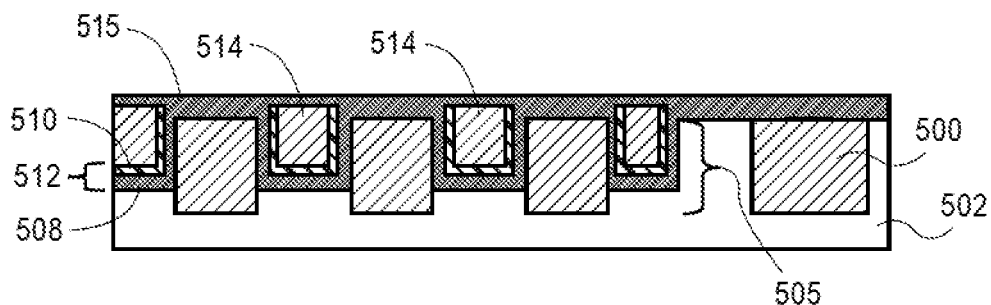

FIG. 5E illustrates the fabrication process after the top electrode plate 514 is formed on the insulator stack 512 by filling in the recesses in the bottom electrode plate 505 with a second low resistivity material. In one embodiment, the second low resistivity metal comprising the top electrode plate 514 may be copper. In this embodiment, the process may include electroplating copper onto a tantalum barrier and a copper seed layer. In one embodiment, the low resistivity material is filled and polished coplanar the etch stop layer 508 on the top surface of the portions of bottom electrode plates 505 protruding from the first dielectric layer 502. As shown, in this embodiment the high-K layer 510 is removed from the top surface of the portions of bottom electrode plate 505 and a second hard mask 515 is also formed on the top electrode plate 514 and on the etch stop layer 508. However, the insulator stack 512 still includes both etch stop layer 508 and the high-K layer 510 along sides and bottom of the recesses filled by the material comprising the top electrode plate 514.

Figure 5F:
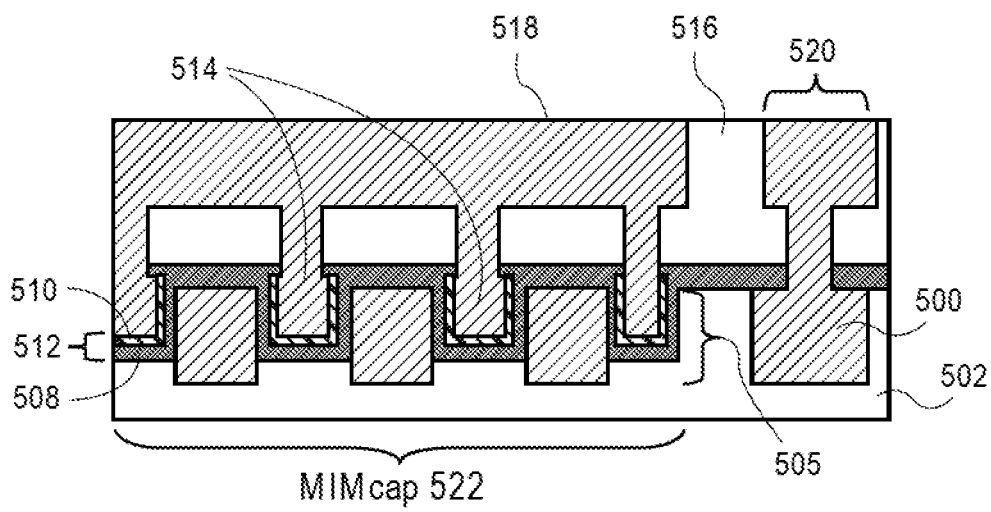

FIG. 5F illustrates the fabrication process after one or more conductive lines 518 are formed over the top electrode plate 514 in a second metal layer (Mn+1) to complete formation of MIMCap 522. In this embodiment, a second dielectric layer 516 is formed on the insulator stack 512 on a top surface of the bottom electrode plate 505. In one embodiment, the top electrode plate 514 may be further connected to one or more the conductive lines 518 in the second metal layer (e.g., M2). In one embodiment, the MIMCap 522 is fabricated adjacent to an interconnect structure 520 spanning the first and second metal layers, as described with respect to FIG. 2A.

FIGS. 6A-6G illustrate an angled three-dimensional view showing the fabrication process for fabricating an IC structure including a low parasitic resistance MIMCap having a planar profile for high-Q operations according to the second embodiment of FIGS. 3A-3B.

Figure 6A:
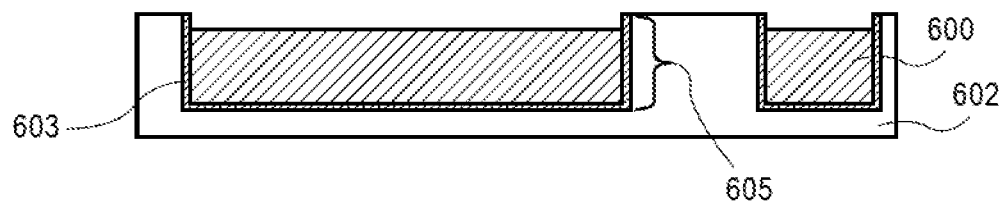
FIGS. 6A-6G illustrate an angled three-dimensional view showing the fabrication process for fabricating an IC structure including a low parasitic resistance MIMCap having a planar profile for high-Q operations according to the second embodiment of FIGS. 3A-3B.

FIG. 6A illustrates the fabrication process after conductive lines 600 comprising a first low resistivity material are formed in a first dielectric layer 602 in a first metal layer (e.g., M1). In one embodiment, the conductive line 600 are formed through patterning, metallization, and polishing steps. In one embodiment, at least one of the conductive lines 600 in the first metal layer is used as the bottom electrode plate 605 of the MIMCap. In one embodiment, sides and bottom of one or more of the conductive line 600 are optionally encapsulated with a barrier layer 603. This may be accomplished as follows. Once a via or a capacitor cavity is formed in the first dielectric layer 602, a barrier layer 603 comprising titanium nitride (TiN) or tantalum (Ta) barrier layer is blanket deposited. A contact displacement technique may be used to form a thin activation seed layer of copper on the barrier layer. An electroless deposition technique may then used to auto-catalytically deposit copper on the activated barrier layer. The electrolysis copper deposition continues until the via/capacitor cavity is filled. Subsequently, the surface is polished by an application of chemical-mechanical polishing (CMP) to remove excess copper and barrier material from the surface, and over polishing is then used to recess the conductive lines 600 and barrier layer 603 from a surface of the first dielectric layer 602, as shown.

Figure 6B:
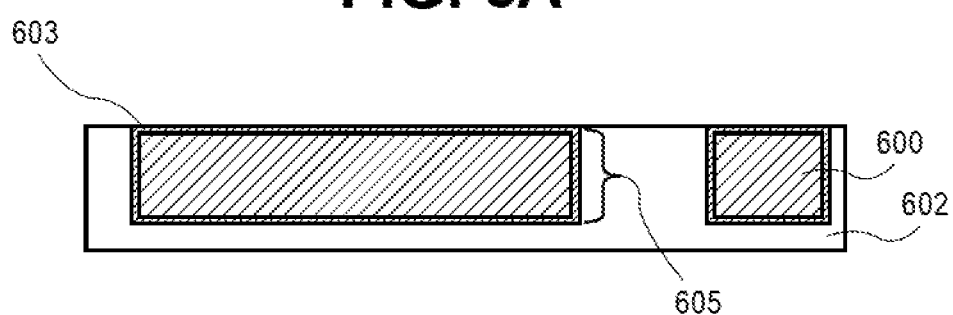

FIG. 6B illustrates the fabrication process after the barrier layer 603 is optionally formed on a top surface of the recessed conductive lines 600 to form a fully clad conductive lines 600 and bottom electrode plate 605. In one embodiment, the bottom electrode 605 is recessed to a depth such that once the barrier layer 603 is formed on the top surface of the bottom electrode plate 605, the barrier layer 603 is coplanar with a top surface of the first dielectric layer 602, as shown. In one embodiment, the barrier layer 603 may have a thickness of approximately 50-1500 angstroms.

Figure 6C:
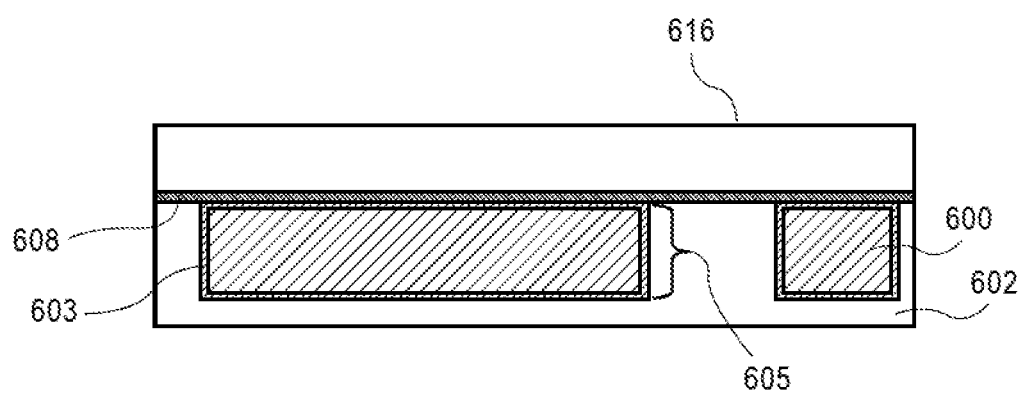

FIG. 6C illustrates the fabrication process after an etch stop layer 608 is formed over the first dielectric layer 602 and the bottom electrode plate 605, and a second dielectric layer 616 is formed over the etch stop layer 608.

Figure 6D:
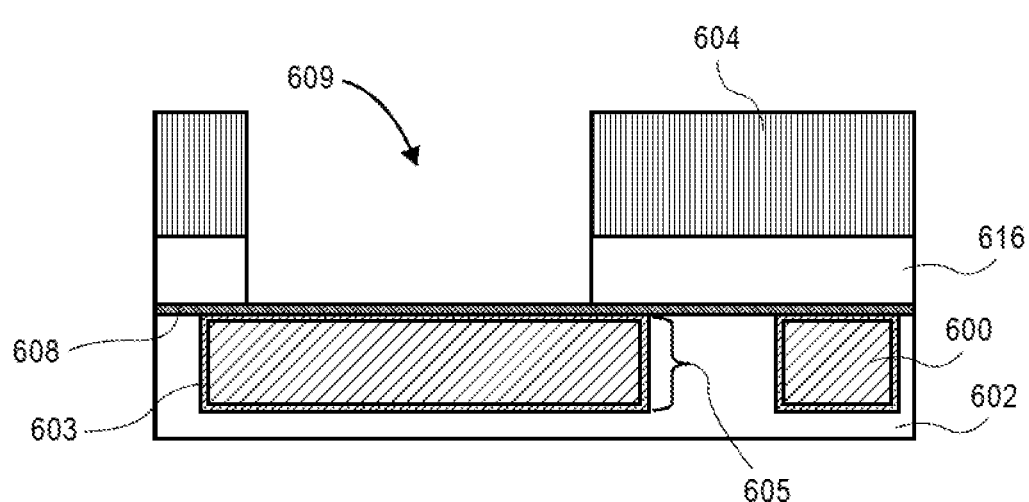

FIG. 6D illustrates the fabrication process after a mask 604 (hard mask or photoresist) is patterned with an opening over the second dielectric layer 616 and the bottom electrode plate 605 where the top electrode plate of the MIMCap will be formed. In one embodiment, the second dielectric layer 616 is etched away in the opening to form a capacitor cavity 609 that lands on the etch stop layer 608. In another embodiment, the capacitor cavity 609 formed in the second dielectric layer 616 lands on the top surface of the bottom electrode plate 605.

Figure 6E:
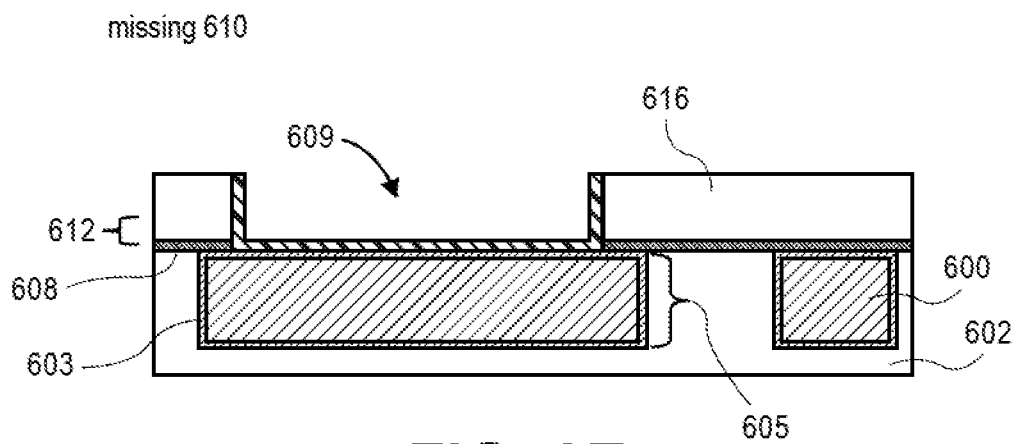

FIG. 6E illustrates the fabrication process after the mask 604 is removed and a high-K layer 610 is conformally formed on sidewalls and bottom of the capacitor cavity 609. In an embodiment where the bottom of the capacitor cavity 609 lands on the etch stop layer 608, the high-K layer 610 is formed on the etch stop layer 608. In an embodiment where the bottom of the capacitor cavity 609 lands on the bottom electrode plate 605, the high-k layer 610 is formed on the bottom electrode plate 605. The high-K layer 610 and optionally the etch stop layer 608 form an insulator stack 612 for the MIMCap.

Figure 6F:
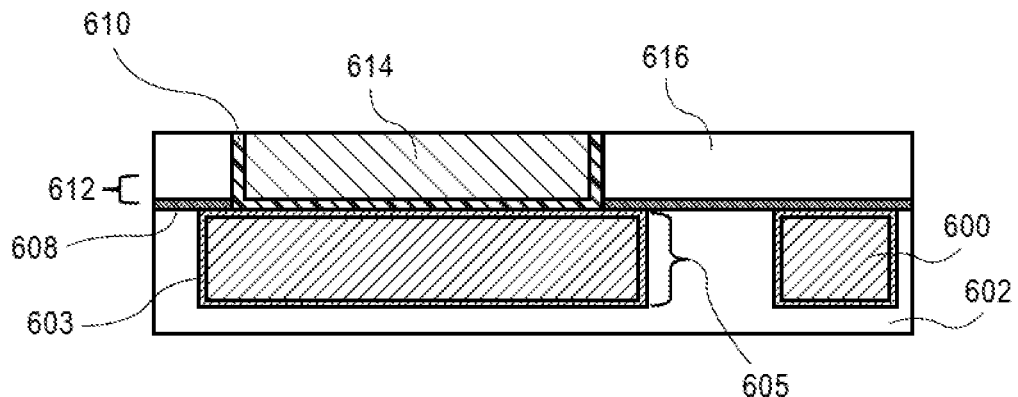

FIG. 6F illustrates the fabrication process after the remainder of the capacitor cavity 609 is filled in with a second low resistivity material to form the top electrode plate 614. In one embodiment, the second low resistivity material of the top electrode plate 614 may be the same as the first low resistivity material comprising the bottom electrode plate 605. In one embodiment, the first and second low resistivity material comprises copper.

Figure 6G:
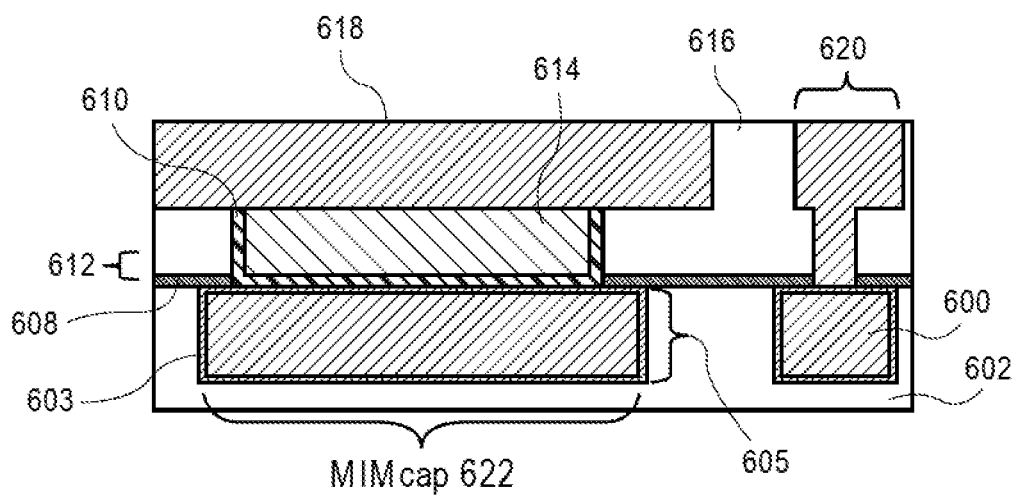

FIG. 6G illustrates the fabrication process after one or more conductive lines 618 are patterned over the top electrode plate 614 in a second metal layer (Mn+1) to complete formation of MIMCap 622. In one embodiment, the MIMCap 622 is fabricated adjacent to an interconnect structure 620 spanning the first and second metal layers, as described with respect to FIG. 2A.

In both FIGS. 5A-5F and 6A-6G, a wide variety of insulator materials may be used for the first dielectric layers 502, 602 and or the second dielectric layers 516, 616. For instance, in some example embodiments, dielectric layers 502, 516, 602, 616 may be formed from an oxide or carbon (C)-doped oxide, such as silicon oxide ($SiO_2$), aluminum oxide ($Al_2O_3$), hafnium oxide ($HfO_2$), zirconium oxide ($ZrO_2$), tantalum oxide ($Ta_2Os$), titanium oxide ($TiO_2$), or lanthanum oxide ($La_2O_3$), among others. In some embodiments, dielectric layers 502, 516, 602, 616 may be formed from a nitride, such as silicon nitride ($Si_3N_4$), or an oxynitride, such as silicon oxynitride (SiON), a carbide, such as silicon carbide (SiC), or an oxycarbonitride, such as silicon oxycarbonitride (SiOCN). In some embodiments, dielectric layers 502, 516, 602, 616 may be formed from a combination of any of the aforementioned materials. In some embodiments, dielectric layers 502, 516, 602, 616 may be a homogeneous dielectric structure (e.g., comprising only a single dielectric material), whereas in other embodiments, dielectric layers 502, 516, 602, 616 may be a heterogeneous dielectric structure (e.g., comprising portions of different dielectric material composition). In some cases, dielectric layers 502, 516, 602, 616 may be configured to serve, at least in part, as an inter-layer dielectric (ILD) for the IC.

In both FIGS. 5A-5F and 6A-6G, the dielectric layers 502, 516, 602, 616 can be formed via any suitable standard, custom, or proprietary technique(s), such as via any one, or combination, of a physical vapor deposition (PVD) process, such as sputter deposition, a spin-on deposition (SOD) process, and a chemical vapor deposition (CVD) process, such as plasma-enhanced CVD (PECVD). The dimensions of dielectric layers 502, 516, 602, 616 may be customized, as desired for a given target application or end-use. In some cases, dielectric layers 502, 516, 602, 616 may have a thickness, for example, in the range of about 50-150 nm (e.g., about 50-100 nm, about 100-150 nm, or any other sub-range in the range of about 50-150 nm). Other suitable materials, formation techniques, and configurations for dielectric layers will depend on a given application and will be apparent in light of this disclosure.

In some cases, dielectric layers may have disposed therein one or more conductive lines or interconnects. In some instances, a plurality of dielectric layers each having one or more conductive lines may be provided. In accordance with some embodiments, a given conductive line may comprise copper (Cu). However, other highly conductive materials may be used. Further note that the interconnect materials may be metallic or non-metallic and may include polymeric materials, in some instances. To this end, any material having a suitable degree of high electrical conductivity can be used for the one or more conductive lines. Also, in some instances, it may be desirable to include a barrier layer between a given conductive line and dielectric layer. For instance, in some cases in which a given conductive line comprises Cu, for example, it may be desirable to include between such conductive line and dielectric layer a barrier and/or adhesion layer comprising a material such as, but not necessarily limited to: tantalum (Ta); tantalum nitride (TaN); titanium nitride (TiN); and the like. A given conductive line may be formed via any suitable standard, custom, or proprietary technique(s), such as via any one, or combination, of an electroplating process, an electroless deposition process, an atomic layer deposition (ALD) process, a PVD process, and a CVD process, among others. The pitch (Pi) or other spacing of neighboring conductive lines may be customized.

In both FIGS. 5A-5F and 6A-6G, etch stop layers 508, 608 may function as an etch barrier during the patterning of other layers as well as function as a hermetic seal that prevents the materials above etch stop layers 508, 608 from exposure to the materials beneath. In an embodiment, the density of etch stop layer should be adequate to seal the bottom electrode plates 505, 605 from exposure to other materials, moisture, or external elements. The density of most materials, such as etch stop layers 508, 608 correlates with their dielectric constant property. For example, a material that has a high density will usually have a high dielectric constant and a material that has a low density will typically have a low dielectric constant. Likewise, etch stop layers 508, 608 may have a high dielectric constant such that the dielectric constant is approximately equal to or greater than 4.5. The etch stop layers 508, 608 may comprise any material with a dielectric constant greater than 4.5 such as silicon nitride, carbon doped silicon nitride, silicon carbide, or nitrogen doped silicon carbide. In an embodiment, etch stop layers 508, 608 comprises silicon nitride. Etch stop layers 508, 608 must also have an adequate thickness to serve as an etch barrier during conductive layer formation and or seal the conductive lines from the surrounding elements.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
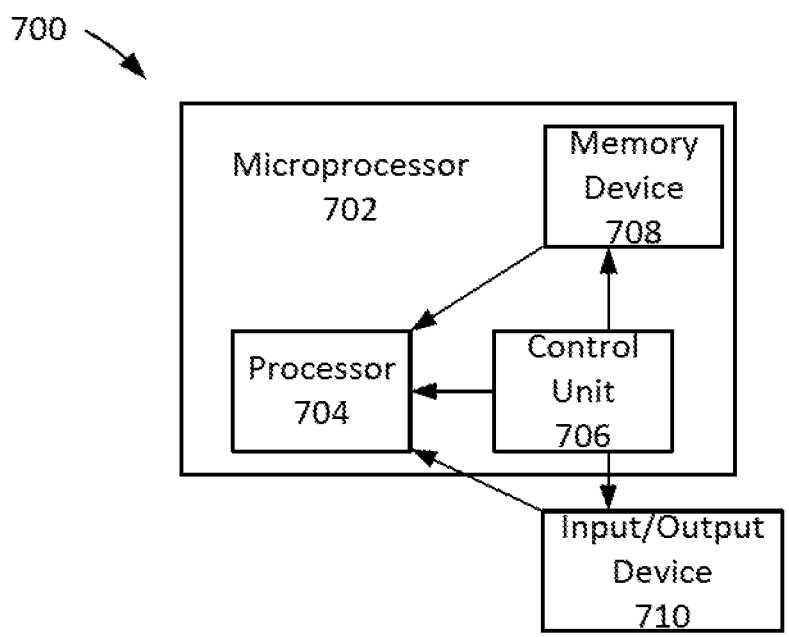
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more high-Q performance MIM capacitors, such as those described herein.

Figure 8:
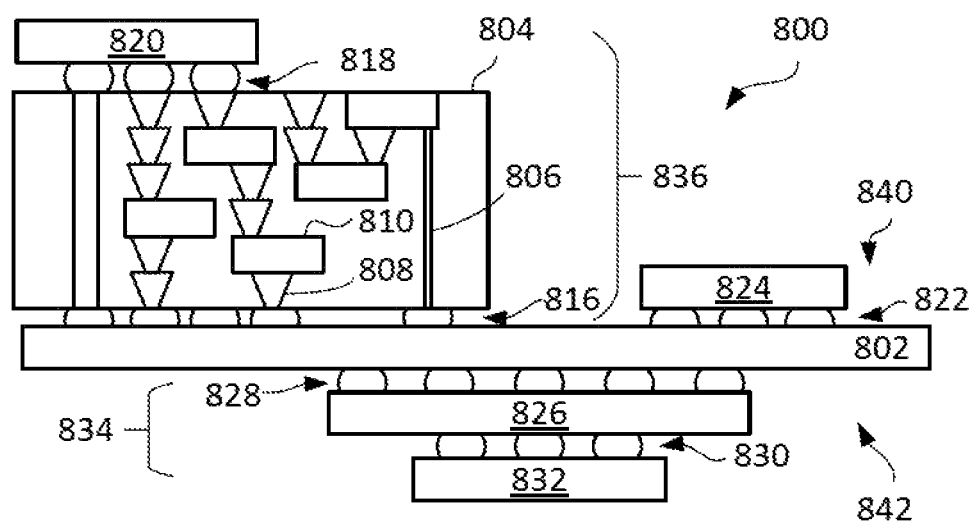
FIG. 8 is a cross-sectional side view of an integrated circuit (IC) device assembly that may include one or more high-Q performance MIMCaps, in accordance with one or more of the embodiments disclosed herein.

FIG. 8 is a cross-sectional side view of an integrated circuit (IC) device assembly that may include one or more high-Q performance MIMCap, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of high-Q performance MIM capacitors.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
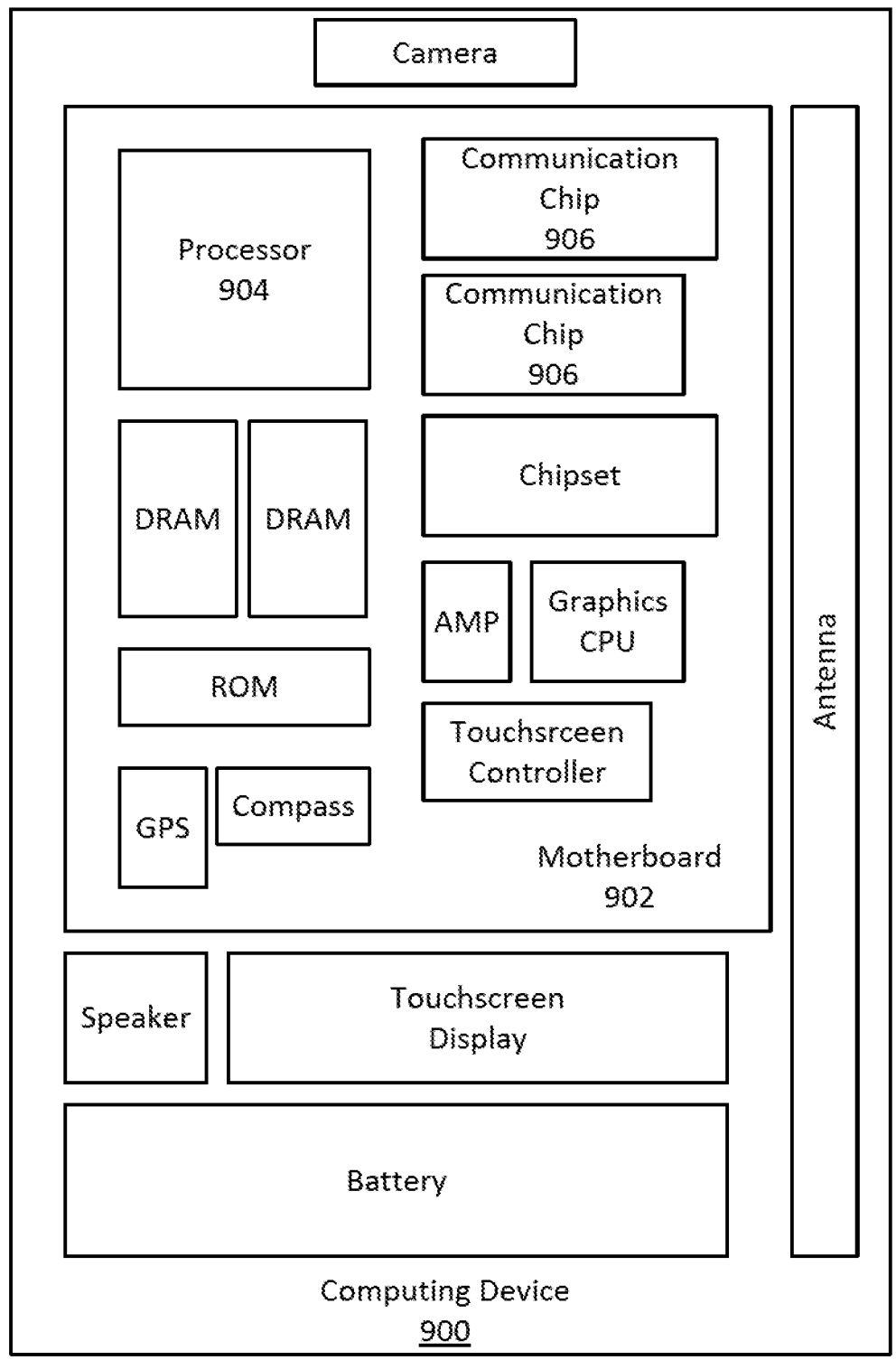
FIG. 9 illustrates a computing device in accordance with one implementation of the disclosure

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more high-Q performance MIM capacitors, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more high-Q performance MIM capacitors, in accordance with implementations of embodiments of the disclosure.

In further implementations, another component housed within the computing device 900 may contain an integrated circuit die that includes one or more high-Q performance MIM capacitors, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include high-Q performance, low-parasitic-resistance MIM capacitors. The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a first dielectric layer disposed above a substrate. The integrated circuit structure comprises an interconnect structure comprising a first interconnect on a first metal layer, a second interconnect on a second metal layer, and a via connecting the first interconnect and the second interconnect, the first interconnect being on or within the first dielectric layer. A metal-insulator-metal (MIM) capacitor is formed in or on the first dielectric layer in the first metal layer adjacent to the interconnect structure. The MIM capacitor comprises a bottom electrode plate comprising a first low resistivity material, an insulator stack on the bottom electrode plate, the insulator stack comprising at least one of an etch stop layer and a high-K dielectric layer; and a top electrode plate on the insulator stack, the top electrode plate comprising a second low resistivity material.

Example embodiment 2: The integrated circuit structure of claim 1, wherein the first low resistivity material of the bottom electrode plate is the same as the second low resistivity material of the top electrode plate.

Example embodiment 3: The integrated circuit structure of claim 1 or 2, wherein the first low resistivity material and the second low resistivity material comprise copper.

Example embodiment 4: The integrated circuit structure of claim 1 or 2, wherein the first low resistivity material of the bottom electrode plate is different than the second low resistivity material of the top electrode plate.

Example embodiment 5: The integrated circuit structure of claim 1, 2, 3, or 4, wherein the MIM capacitor has a Q factor value selected from: approximately 10,000 at 1 MHz; approximately 1,000 at 100 MHz; approximately 250 at 5 GHz; and approximately 50 at 30 GHz.

Example embodiment 6: The integrated circuit structure of claim 1, 2, 3, 4 or 5, wherein the high-K dielectric layer comprises at least one of: hafnium oxide, hafnium oxynitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate.

Example embodiment 7: The integrated circuit structure of claim 1, 2, 3, 4, 5 or 6, wherein the MIM capacitor has a corrugated profile in which the bottom electrode plate further comprises a plurality of two or more floating conductive lines that have portions protruding from a surface of the first dielectric layer and are laterally spaced apart by air gaps that form recesses there between, wherein the insulator stack is conformally disposed on sides and tops of two or more floating conductive lines protruding from the first dielectric layer and on the surface of the first dielectric layer between the two or more floating conductive lines, and wherein the top electrode plate is disposed on the insulator stack on sides and bottom of the recesses between the two or more floating conductive lines comprising the bottom electrode plate.

Example embodiment 8: The integrated circuit structure of claim 1, 2, 3, 4, 5, 6 or 7, wherein the two or more floating conductive lines are laterally spaced apart by approximately 80-160 nm.

Example embodiment 9: The integrated circuit structure of claim 1, 2, 3, 4, 5, 6 or 7, wherein the insulator stack has a thickness of approximately 50 nm to provide a high-K, low voltage etch stop, and a thickness of up to 200 nm to provide a high voltage etch stop.

Example embodiment 10: An integrated circuit structure comprises a first dielectric layer disposed above a substrate. The integrated circuit structure comprises an interconnect structure comprising a first interconnect on a first metal layer, a second interconnect on a second metal layer, and a via connecting the first interconnect and the second interconnect, the first interconnect being on or within the first dielectric layer. A metal-insulator-metal (MIM) capacitor having a planar profile is formed adjacent to the interconnect structure. The MIM capacitor comprises a bottom plate in the first metal layer formed from a conductive line comprising a first low resistivity material. A capacitor cavity is formed on the bottom electrode plate in the second dielectric layer. The insulator stack comprises at least one of etch stop layer and high-K dielectric layer formed on the bottom on the capacitor cavity. The top electrode plate comprises the second low resistivity material filling a remainder of the capacitor cavity.

Example embodiment 11: The integrated circuit structure of claim 10, wherein a bottom of the capacitor cavity is formed on the etch stop layer and the high-K dielectric layer is conformally disposed on the etch stop layer and on sidewalls of the capacitor cavity to form the insulator stack.

Example embodiment 12: The integrated circuit structure of claim 10, wherein the capacitor cavity is formed directly on the bottom electrode plate and the high-K dielectric layer is conformally disposed on both the bottom and sidewalls of the capacitor cavity.

Example embodiment 13: The integrated circuit structure of claim 10, 11 or 12, wherein a second conductive line is formed on the top electrode plate in the second metal layer.

Example embodiment 14: The integrated circuit structure of claim 10, 11, 12 or 13, wherein the bottom electrode plate is fully clad with a barrier layer to form a fully clad bottom electrode plate.

Example embodiment 15: The integrated circuit structure of claim 14, wherein the barrier layer comprises tantalum.

Example embodiment 16: The integrated circuit structure of claim 14, wherein the capacitor cavity is formed on the fully clad bottom electrode plate.

Example embodiment 17: The integrated circuit structure of claim 10, 11, 12, 13, 14, 15 or 16, wherein the capacitor cavity is approximately 5-100 nanometers in thickness.

Example embodiment 18: The integrated circuit structure of claim 10, 11, 12, 13, 14, 15, 16 or 17, wherein a size of the capacitor cavity is greater than approximately 500×500 nanometers and less than 10×10 microns.

Example embodiment 19: A method of fabricating a metal-insulator-metal (MIM) capacitor comprises forming a first electrode plate comprising a first low resistivity material in or on a first dielectric layer adjacent to an interconnect structure that spans first and second metal layers. An insulator stack is formed in electrical contact with the first electrode plate, the insulator stack comprising at least one of an etch stop layer and a high-K dielectric layer. A second electrode plate comprising a second low resistivity material is formed on and in electrical contact with the insulator stack.

Example embodiment 20: The method of claim 19, further comprising cladding the first electrode plate with a barrier layer to form a fully clad first electrode plate.

Example embodiment 21: The method of claim 19 or 20, further comprising using copper for both the first low resistivity material and the second low resistivity material.

Example embodiment 22: The method of claim 19, 20 or 21, further comprising forming the MIM capacitor with a corrugated profile by: forming floating conductive lines in the first dielectric layer in a first metal layer, wherein at least a portion of the floating conductive lines form the first electrode plate; performing an air gap etch on the first dielectric layer to form recesses therein that exposes upper portions of the first electrode plate from the first dielectric layer; forming the etch stop layer over the first dielectric layer and exposed upper portions of the first electrode plate; forming the high-K dielectric layer over the etch stop layer; and forming the second electrode plate on the insulator stack by filling in the recesses between the first electrode plate with the second low resistivity material.

Example embodiment 23: The method of claim 19, 20, 21 or 22, forming one or more conductive lines over the second electrode plate in a second metal layer.

Example embodiment 24: The method of claim 19, 20 or 21, further comprising forming the MIM capacitor with a having a planar profile by: forming conductive lines in the first dielectric layer in a first metal layer, wherein at least one of the conductive lines form the first electrode plate; forming the etch stop layer over the first dielectric layer and the first electrode plate, and forming a second dielectric layer over the etch stop layer; forming a capacitor cavity in the second dielectric layer over the first electrode plate; forming the high-K dielectric layer on sidewalls and bottom of the capacitor cavity; and filling a remainder of the capacitor cavity with the second low resistivity material to form the first electrode plate.

Example embodiment 25: The method of claim 19, 20, 21 or 24, further comprising encapsulating the conductive lines on the first metal layer with respective barrier layers to form fully clad conductive lines.

What is claimed is:

1. A method of fabricating a metal-insulator-metal (MIM) capacitor, the method comprising:
    forming a first electrode plate comprising a first low resistivity material in or on a first dielectric layer adjacent to an interconnect structure that spans first and second metal layers;
    forming an insulator stack in electrical contact with the first electrode plate, the insulator stack comprising at least one of an etch stop layer and a high-K dielectric layer;
    forming a second electrode plate comprising a second low resistivity material on and in electrical contact with the insulator stack; and
    forming the MIM capacitor with a planar profile by:
    forming conductive lines in the first dielectric layer in a first metal layer, wherein at least one of the conductive lines form the first electrode plate;
    forming the etch stop layer over the first dielectric layer and the first electrode plate, and forming a second dielectric layer over the etch stop layer;
    forming a capacitor cavity in the second dielectric layer over the first electrode plate laterally across the second metal layer;
    forming the high-K dielectric layer on sidewalls and bottom of the capacitor cavity; and
    filling a remainder of the capacitor cavity with the second low resistivity material to form the first electrode plate.

2. The method of claim 1, further comprising encapsulating the conductive lines on the first metal layer with respective barrier layers to form fully clad conductive lines.

3. A method of fabricating a metal-insulator-metal (MIM) capacitor, the method comprising:
    forming a first electrode plate comprising a first low resistivity material in or on a first dielectric layer adjacent to an interconnect structure that spans first and second metal layers;
    forming an insulator stack in electrical contact with the first electrode plate, the insulator stack comprising at least one of an etch stop layer and a high-K dielectric layer;
    forming a second electrode plate comprising a second low resistivity material on and in electrical contact with the insulator stack; and
    forming the MIM capacitor with a corrugated profile by:
    forming floating conductive lines in the first dielectric layer in a first metal layer, wherein at least a portion of the floating conductive lines form the first electrode plate;
    performing an air gap etch on the first dielectric layer to form recesses therein that exposes upper portions of the first electrode plate from the first dielectric layer;
    forming the etch stop layer over the first dielectric layer and exposed upper portions of the first electrode plate;
    forming the high-K dielectric layer over the etch stop layer; and
    forming the second electrode plate on the insulator stack by filling in the recesses between the first electrode plate with the second low resistivity material.

4. The method of claim 3, forming one or more conductive lines over the second electrode plate in a second metal layer.

5. The method of claim 3, further comprising cladding the first electrode plate with a barrier layer to form a fully clad first electrode plate.

6. The method of claim 3, further comprising using copper for both the first low resistivity material and the second low resistivity material.

7. An integrated circuit structure, comprising:
a first dielectric layer disposed above a substrate;
an interconnect structure comprising a first interconnect on a first metal layer, a second interconnect on a second metal layer, and a via connecting the first interconnect and the second interconnect, the first interconnect being on or within the first dielectric layer; and
a metal-insulator-metal (MIM) capacitor formed adjacent to the interconnect structure, the MIM capacitor having a planar profile comprising:
a bottom electrode plate in the first metal layer formed from a conductive line, wherein the bottom electrode comprises a plurality of two or more floating conductive lines that have portions protruding from a surface of the first dielectric layer and are laterally spaced apart, and a first low resistivity material;
a capacitor cavity formed on the bottom electrode plate in a second dielectric layer laterally across the second metal layer;
an insulator stack comprising at least one of an etch stop layer and a high-K dielectric layer formed on a bottom on the capacitor cavity; and
a top electrode plate disposed on the insulator stack on sides and bottom of the recesses between the two or more floating conductive lines comprising the bottom electrode plate, and comprising a second low resistivity material filling a remainder of the capacitor cavity.

8. The integrated circuit structure of claim 7 wherein the etch stop layer is formed on the bottom electrode plate, the bottom of the capacitor cavity is formed on the etch stop layer, and the high-K dielectric layer is conformally disposed on the etch stop layer and on sidewalls of the capacitor cavity to form the insulator stack.

9. The integrated circuit structure of claim 7, wherein the capacitor cavity is formed directly on the bottom electrode plate and the high-K dielectric layer is conformally disposed on both the bottom and sidewalls of the capacitor cavity.

10. The integrated circuit structure of claim 7, wherein a size of the capacitor cavity is greater than approximately 500×500 nanometers and less than 10×10 microns.

11. The integrated circuit structure of claim 7, wherein a second conductive line is formed on the top electrode plate in a second metal layer.

12. The integrated circuit structure of claim 7, wherein the capacitor cavity is approximately 5-100 nanometers in thickness.

13. The integrated circuit structure of claim 7, wherein the bottom electrode plate is fully clad with a barrier layer to form a fully clad bottom electrode plate.

14. The integrated circuit structure of claim 13, wherein the capacitor cavity is formed on the fully clad bottom electrode plate.

15. The integrated circuit structure of claim 13, wherein the barrier layer comprises tantalum.

16. An integrated circuit structure, comprising:
a first dielectric layer disposed above a substrate;
an interconnect structure comprising a first interconnect on a first metal layer, a second interconnect on a second metal layer, and a via connecting the first interconnect and the second interconnect, the first interconnect being on or within the first dielectric layer; and
a metal-insulator-metal (MIM) capacitor formed in or on the first dielectric layer in the first metal layer adjacent to the interconnect structure, the MIM capacitor comprising:
a bottom electrode plate comprising a first low resistivity material;
an insulator stack on the bottom electrode plate, the insulator stack comprising at least one of an etch stop layer and a high-K dielectric layer; and
a top electrode plate on the insulator stack, the top electrode plate comprising a second low resistivity material, wherein the MIM capacitor has a corrugated profile across the first metal layer in which the bottom electrode plate further comprises a plurality of two or more floating conductive lines that have portions protruding from a surface of the first dielectric layer and are laterally spaced apart, wherein the insulator stack is conformally disposed on sides and tops of two or more floating conductive lines protruding from the first dielectric layer and on the surface of the first dielectric layer between the two or more floating conductive lines, and wherein the top electrode plate is disposed on the insulator stack on sides and bottom of the recesses between the two or more floating conductive lines comprising the bottom electrode plate.

17. The integrated circuit structure of claim 16, wherein the high-K dielectric layer comprises at least one of: hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate.

18. The integrated circuit structure of claim 16, wherein the insulator stack has a thickness of approximately 50 nm to provide a high-K, low voltage etch stop, and a thickness of up to 200 nm to provide a high voltage etch stop.

19. The integrated circuit structure of claim 16, wherein the MIM capacitor has a Q factor value selected from: approximately 10,000 at 1 MHz; approximately 1,000 at 100 MHz; approximately 250 at 5 GHz; and approximately 50 at 30 GHz.

20. The integrated circuit structure of claim 16, wherein the first low resistivity material of the bottom electrode plate is different than the second low resistivity material of the top electrode plate.

21. The integrated circuit structure of claim 16, wherein the two or more floating conductive lines are laterally spaced apart by approximately 80-160 nm.

22. The integrated circuit structure of claim 16, wherein the first low resistivity material of the bottom electrode plate is the same as the second low resistivity material of the top electrode plate.

23. The integrated circuit structure of claim 22, wherein the first low resistivity material and the second low resistivity material comprise copper.

* * * * *